United States Patent [19]

Freedman

[11] 3,829,853

[45] Aug. 13, 1974

[54] HIGH-SPEED ANALOG-TO-DIGITAL CONVERTER

[75] Inventor: David Daniel Freedman, Cinnaminson, N.J.

[73] Assignee: RCA Corporation, New York, N.Y.

[22] Filed: Aug. 7, 1972

[21] Appl. No.: 278,270

[52] U.S. Cl. .......................................... 340/347 AD

[51] Int. Cl. .......................................... H03k 13/02

[58] Field of Search ....... 340/347 AD; 307/218, 235

[56] References Cited

UNITED STATES PATENTS

| | | | |
|---|---|---|---|
| 3,072,332 | 1/1963 | Margopoulos | 340/347 AD |
| 3,241,135 | 3/1966 | Kuflik | 340/347 AD |
| 3,417,262 | 12/1968 | Yao | 307/218 |
| 3,500,381 | 3/1970 | Conway | 340/347 AD |
| 3,588,545 | 6/1971 | Wright | 307/218 |
| 3,597,761 | 8/1971 | Fraschilla | 340/347 AD |
| 3,611,350 | 10/1971 | Leibowitz et al. | 340/347 AD |

OTHER PUBLICATIONS

Pressman, "Design of Transistorized Circuits . . ," J. F. Ryder, 3/1959, pp. 10–274 to 10–277.

Hoeschele, "A–D/D–A Conversion Techniques," J. Wiley & Sons, 8/1968, pp. 361–363.

*Primary Examiner*—Thomas J. Sloyan

*Attorney, Agent, or Firm*—Edward J. Norton; Carl M. Wright

[57] ABSTRACT

An analog input voltage is fed to each input of a plurality of comparators. The other input of each comparator is connected to a source of reference potential having a plurality of fixed reference voltage levels representing the digital quantization levels. The outputs of the comparators drive encoding logic including a plurality of clocked flip-flop stages. The complementary outputs of the flip-flop stages are connected to corresponding output lines to provide the binary digits of the equivalent digital word. The parallel-binary output signal is, at any instant, a true representation of the analog input voltage, that was present at the output of the comparators preceding each clock pulse.

1 Claim, 3 Drawing Figures

HIGH-SPEED ANALOG-TO-DIGITAL CONVERTER

BACKGROUND OF THE INVENTION

Analog-to-digital (A/D) converters are generally well known in the art. These converters are used to convert an analog input signal, which may be a voltage or current, into an equivalent digital word. There are several applications where analog signals to be converted to digital form change at megahertz frequencies, such as the video signal in a television system, or the return signal of a monopulse radar system. A/D converters adapted for use in these applications must be capable of operating at correspondingly high speeds. It is also known that the highest-speed electronic A/D converters suitable for use at these frequencies are of the parallel type. The parallel or, as they are sometimes called, simultaneous A/D converters convert the analog input signal which may be, for example, a voltage into an encoded digital word by making a direct comparison between the analog input voltage and a reference voltage or voltages. These converters use an analog comparator for every desired quantization level in the encoded digital word. The individual analog comparators typically have one input connected to the analog input voltage and a second input connected to reference voltage representing the respective quantization level.

An example of the parallel type of A/D converter can be found in Schmid. *Electronic Analog/Digital Conversions*, Van Nostrand Reinhold Co., 1970, page 296.

Typically, these converters process the output provided by the respective comparators through appropriately chosen encoding or conversion logic to provide a parallel, binary output word. The digital information provided by the encoding logic is then further processed and utilized by bistable memory elements such as triggerable flip-flops arranged in a "pipeline" configuration. These prior art converters operate at speeds limited only by the delays of the comparators *and* the delays provided by logic gates in the encoding logic circuitry. However, the delays of these prior art converters are recognized as being a significant disadvantage; for example, while discussing the factors limiting static accuracy of converters operating at high clock frequencies, the above-mentioned reference of Schmid indicates, at page 495, that logic delays are one of these factors. It is said therein that although present day integrated circuit logic lines (families) are all very fast, if several logic elements are cascaded, these delays can be appreciable. Additional examples of parallel A/D converters can be found in Hoeschele, *Analog-to-Digital/Digital-to-Analog Conversion Techniques*, John Wiley and Sons, Inc., 1968; for example, see pages 409–412. It can be seen that the encoding logic of the parallel A/D converters shown in the last-mentioned reference also labor with the delays discussed above.

The delays occasioned by the encoding logic used in these prior art A/D converters not only limit the maximum clocking rate of the converter but the resulting differential time delays between the output lines which provide the binary digits of the encoded digital word often require further processing in order to obtain a useable digital output. That is, since the various binary digits experience different delays, the digital output word at any given instant is not a true representation of the analog signal unless all of the delays are equalized, for example, by precision delay lines. Sample and hold circuits, which sample the analog input signal over a selected time interval and hold this signal over the longest encoding logic delay period, are sometimes used to avoid the differential delay problem of the prior art. However, the highest or maximum operating speed of the A/D converter is nevertheless limited by the longest delay experienced in the encoding logic.

These disadvantages of the prior art A/D converters are overcome by the present invention, as the encoding operation is performed without logic gate delay. The present invention is realized by employing high-speed logic circuits of the type disclosed in U.S. Pat. application, Ser. No. 200,796, filed on Nov. 22, 1971, now abandoned, and continuation application, Ser. No. 278,271, filed Aug. 7, 1972, both in the name of David Daniel Freedman.

SUMMARY OF THE INVENTION

Briefly, the present invention provides an analog-to-digital converter comprising an analog input and a given number of output lines each providing a binary digit of a digital word representing given quantized analog input levels. A plurality of comparators is provided, each comparator having a first input adapted for coupling to a source of reference potential for applying a predetermined reference potential to each comparator and each comparator having a second input coupled to the analog input. The output of each of the comparators is selectively coupled to respective inputs of a plurality of triggerable flip-flops. The flip-flops each have a complementary output coupled to a selected one of the output lines.

BRIEF DESCRIPTION OF THE DRAWINGS

The advantages of this invention will become more readily appreciated as the same becomes better understood by reference to the following detailed description when taken in conjunction with the accompanying drawing wherein.

DETAILED DESCRIPTION

Figure 1:
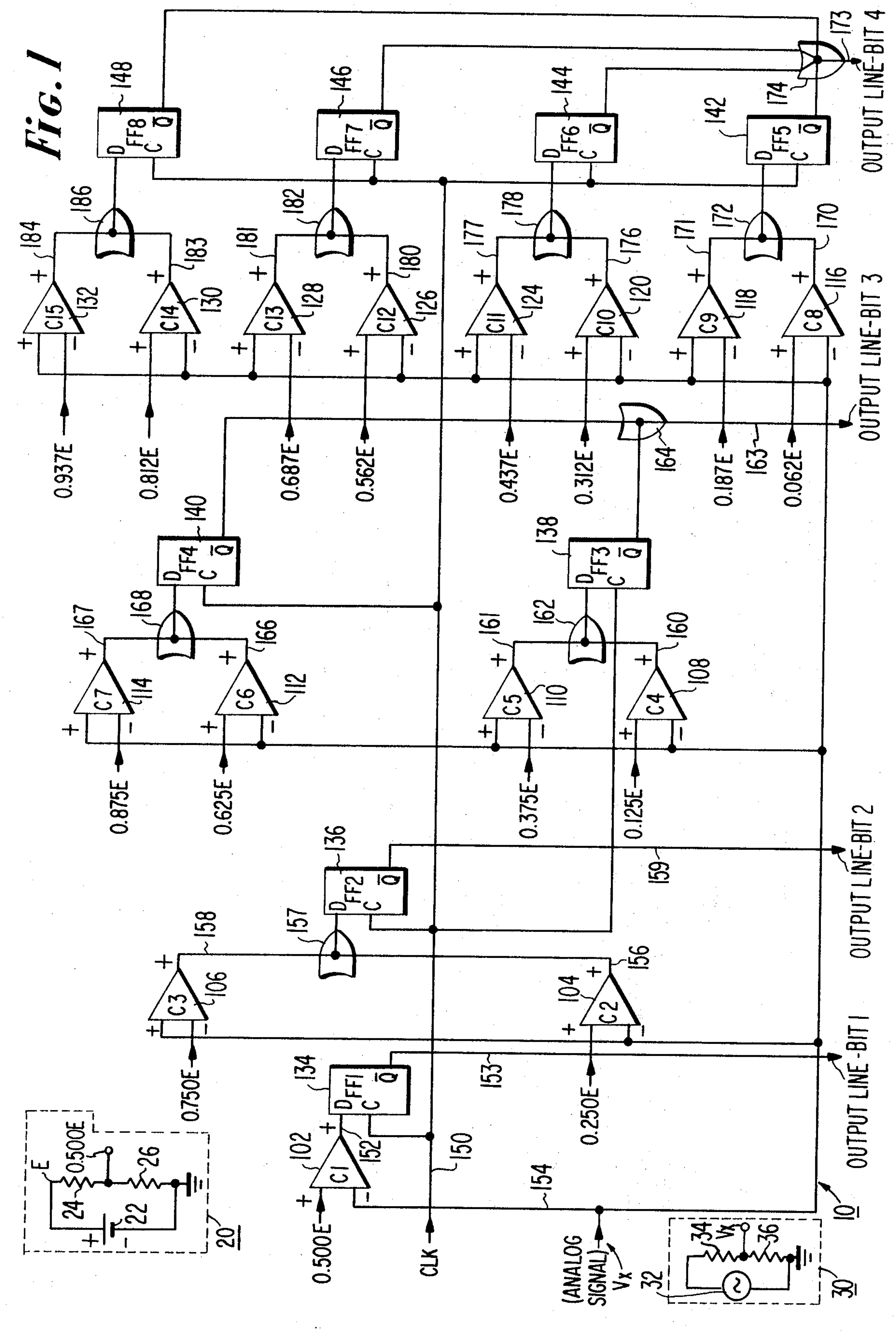
FIG. 1 is a block diagram of a parallel A/D converter which provides a four bit, digital word in accordance with the present invention.

Referring now to the drawing, there is shown in FIG. 1 a parallel A/D converter 10 in accordance with the present invention. A/D converter 10 converts an analog input signal $V_x$ into an equivalent digital word. The digital word, representing given quantization levels of the analog input signal $V_x$, is provided at four output lines with each line providing one bit of the digital word. Parallel or simultaneous A/D converters use one analog comparator, with a fixed reference potential at one of the comparator inputs, for every quantization level in the digital word between zero and full scale. Accordingly, an N bit converter, where N equals the number of binary digits in the digital word, requires $2^N - 1$ comparators. The analog input signal is coupled to the other input of each comparator so that an analog comparison can be made with the reference potential at each quantization level. Each comparator is arranged to give an output only if the level of the analog input signal lies above or below the reference potential applied to the comparator. The outputs of the comparators drive encoding logic to generate the equivalent digital word.

It is known in the art that large ambiguities in the digital readout can occur in parallel A/D converters around the comparator threshold values, i.e. the input values which cause a transistion to occur at the comparator output. That is, if the analog input signal applied to the comparator is at the threshold level, the comparator output may not accurately represent the true analog input level. To avoid or at least minimize this problem it is common, in the art, to encode the comparator to a Gray code first and then, if desired, decode the Gray code to the conventional binary code. The Gray code is a unit-increment code, sometimes referred to as the cyclic code or the reflected binary code. The Gray code is unambiguous because only one bit changes state for each incremental change in the values of the digital word. For these reasons, the exemplary A/D converter of the present invention, as shown in FIG. 1, is arranged in a preferred form so as to provide a Gray code output.

The A/D converter 10 of FIG. 1 is shown in conjunction with a source of reference potential 20. Source 20 provides a fixed reference voltage for each comparator of converter 10. Source 20 includes a stabilized power supply shown as a battery 22 having a terminal potential E. Poled across battery 22 is a chain of serially coupled precision resistors 24 and 26. For clarity, only two representative resistors are shown. The junction of resistors 24 and 26 provides fixed reference voltage 0.500E which is a predetermined fraction of the full scale output voltage E. This fixed reference potential is coupled to a corresponding comparator input of converter 10. The reference potential inputs for the remaining comparators of FIG. 1 are taken from source 20 in a similar manner (not shown). The converter 10 of FIG. 1 is also shown in conjunction with an analog signal source 30. Source 30 provides the analog signal $V_x$ which is a scaled or normalized translation of the output from analog signal generator 32. Precision resistors 34 and 36 are poled across generator 32. The junction of resistors 34 and 36 provides an output terminal for analog signal $V_x$. The values of resistors 34 and 36 can be chosen so that the maximum amplitude of $V_x$ is equal to the maximum amplitude of the reference potential or E.

Referring now in more detail to the structure of converter 10 of FIG. 1, it can be seen that since four output lines, representing N or four binary digits of the digital output word, are provided, converter 10 utilizes $2^N - 1$ or 15 comparators. The comparators are shown with legends C1 to C15 and are designated as 102, 104, etc. to 132. Each comparator includes two input terminals, the first input designated "+" and the second input designated "−". As is well known in the art, each comparator may comprise, for example, a differential amplifier, a Schmidt trigger or any other suitable threshold detector. The output of each comparator is designated as + to indicate that its output will be in the "high" or logic "1" state when a potential applied to the + input of the comparator is greater in magnitude than a potential simultaneously applied to the − input of the comparator. Conversely, the output of the comparator will be in the "low" or logic "0" state when the potential at its − input is greater than the potential at its + input.

The output of each comparator is coupled to one of eight bistable multivibrators (flip-flops) which are shown with legends FF1 to FF8. The flip-flops are designated as 134, 136, etc. to 148. Each flip-flop includes a D input terminal, a $\overline{Q}$ or complementary output terminal and a C or clock pulse input terminal. Flip-flops of this type are known in the art as D-type flip-flops. However, it will be understood that the present invention is not limited to any particular type of bistable multivibrator. The $\overline{Q}$ output of each flip-flop is coupled to a selected one of the four output lines of converter 10. The C or clock pulse input of each flip-flop is coupled to clock line 150 which is, in turn, fed by a clock signal source CLK (not shown).

The output 152 of comparator 102 is coupled to the D input of flip-flop 134. The $\overline{Q}$ output of flip-flop 134 is coupled to output line 153 of converter 10. The + input of comparator 102 is coupled to the 0.500E reference potential provided by source 20. The − input of comparator 102 is coupled to analog signal line 154 which, in turn, is coupled to the $V_x$ output of source 30.

The output 156 of comparator 104 is coupled to the D input of flip-flop 136 by way of phantom-OR (wired-OR) gate 157. The output of comparator 106 is coupled to the D input of flip-flop 136 also by way of phantom-OR gate 157. The $\overline{Q}$ output of flip-flop 136 is coupled to output line 159. The + input of comparator 104 is coupled to a 0.250E fixed reference potential provided by source 20. The − input of comparator 104 is coupled to line 154. The + input of comparator 106 is also coupled to line 154 whereas the − input of comparator 106 is coupled to a 0.750E reference provided by source 20.

The outputs 160 and 161 of comparators 108 and 110, respectively, are coupled to the D input of flip-flop 138 by way of phantom-OR gate 162. The $\overline{Q}$ output of flip-flop 138 is coupled to output line 163 by way of phantom-OR gate 164. The − input of comparator 108 is coupled to line 154 while its + input is coupled to a 0.125E reference potential. The + input of comparator 110 is coupled to line 154 and its − input is coupled to a 0.375E reference potential. Similarly, the outputs 166 and 167 of comparators 112 and 114, respectively, are coupled to the D input of flip-flop 140 by way of phantom-OR gate 168. The $\overline{Q}$ output of flip-flop 140 is coupled to output line 163 by way of phantom-OR gate 164. The − input of comparator 112 is coupled to line 154 and its + input is coupled to a 0.625E reference potential. The + input of comparator 114 is coupled to line 154 and its − input is coupled to a 0.875E reference potential.

The outputs 170 and 171 of comparators 116 and 118, respectively, are coupled to the D input of flip-flop 142 by way of phantom-OR gate 172. The $\overline{Q}$ output of flip-flop 142 is coupled to output line 173 by way of phantom-OR gate 174. The − input of comparator 116 is coupled to line 154 and its + input is coupled to a 0.062E reference potential. The + input of comparator 118 is coupled to line 154 while its − input is coupled to a 0.187E reference potential. Similarly, the outputs 176 and 177 of comparators 120 and 124, respectively, are coupled to the D input of flip-flop 144 by way of phantom-OR gate 178. The $\overline{Q}$ output of flip-flop 144 is coupled to output line 173 by way of phantom- OR gate 174. The − input of comparator 120 is coupled to line 154 and its + input is coupled to a 0.312E reference potential. The + input of comparator 124 is coupled to line 154 and its − input is coupled to a 0.437E reference potential.

The outputs 180 and 181 of comparators 126 and 128, respectively, are coupled to the D input of flip-flop 146 by way of phantom-OR gate 182. The $\overline{Q}$ output of flip-flop 146 is coupled to output line 173 by way of phantom-OR gate 174. The − input of comparator 126 is coupled to line 154 and its + input is coupled to a 0.562E reference potential. The + input of comparator 128 is coupled to line 154 and its − input is coupled to a 0.687E reference potential. Finally, with respect to the illustrative embodiment of FIG. 1, the outputs 183 and 184 of comparators 130 and 132, respectively, are coupled to the D input of flip-flop 148 by way of phantom-OR gate 186. The $\overline{Q}$ output of flip-flop 148 is coupled to output line 173 by way of phantom-OR gate 174. The − input of comparator 130 is coupled to line 154 and its + input is coupled to a 0.812E reference potential. The + input of comparator 132 is coupled to line 154 and its − input is coupled to a 0.937E reference potential.

Phantom-OR gates 157, 162, 168, 172, 178, 182 and 186 each have two inputs coupled to respective comparator outputs and a single output coupled to its corresponding flip-flop D inputs. Phantom-OR gate 164 has two inputs coupled to the $\overline{Q}$ outputs of flip-flops 138 and 140 and a single output coupled to output line 163. Phantom-OR gate 174 has four inputs coupled to respective $\overline{Q}$ flip-flop outputs and a single output coupled to output line 173. As known in the art, a phantom-OR (also known as implicit or wired-OR) gate function is generally obtained by directly coupling together the outputs of two or more logic elements. This phantom-OR capability is inherent to the output circuitry of appropriately chosen logic elements. That is, the output circuits of the logic elements must be of the type which permit direct or hard-wire coupling without inhibiting the internal operation of the logic element and such that the combined outputs will OR in response to one logic input level and AND in response to a second logic input level. In the present invention this capability provides a phantom logic function wherein the output of each of the above-mentioned phantom-OR gates is in the high or logic 1 state if either one or more of the inputs to the gate is in the logic 1 state and wherein the output of the gate is in the low or logic 0 state only when all inputs to the gate are in the logic 0 state. As will be described hereinafter with reference to FIG. 3, it is also possible to obtain the phantom-OR logic function with logic elements which are not amenable to directly coupling together the outputs of two or more logic elements.

Figure 2:
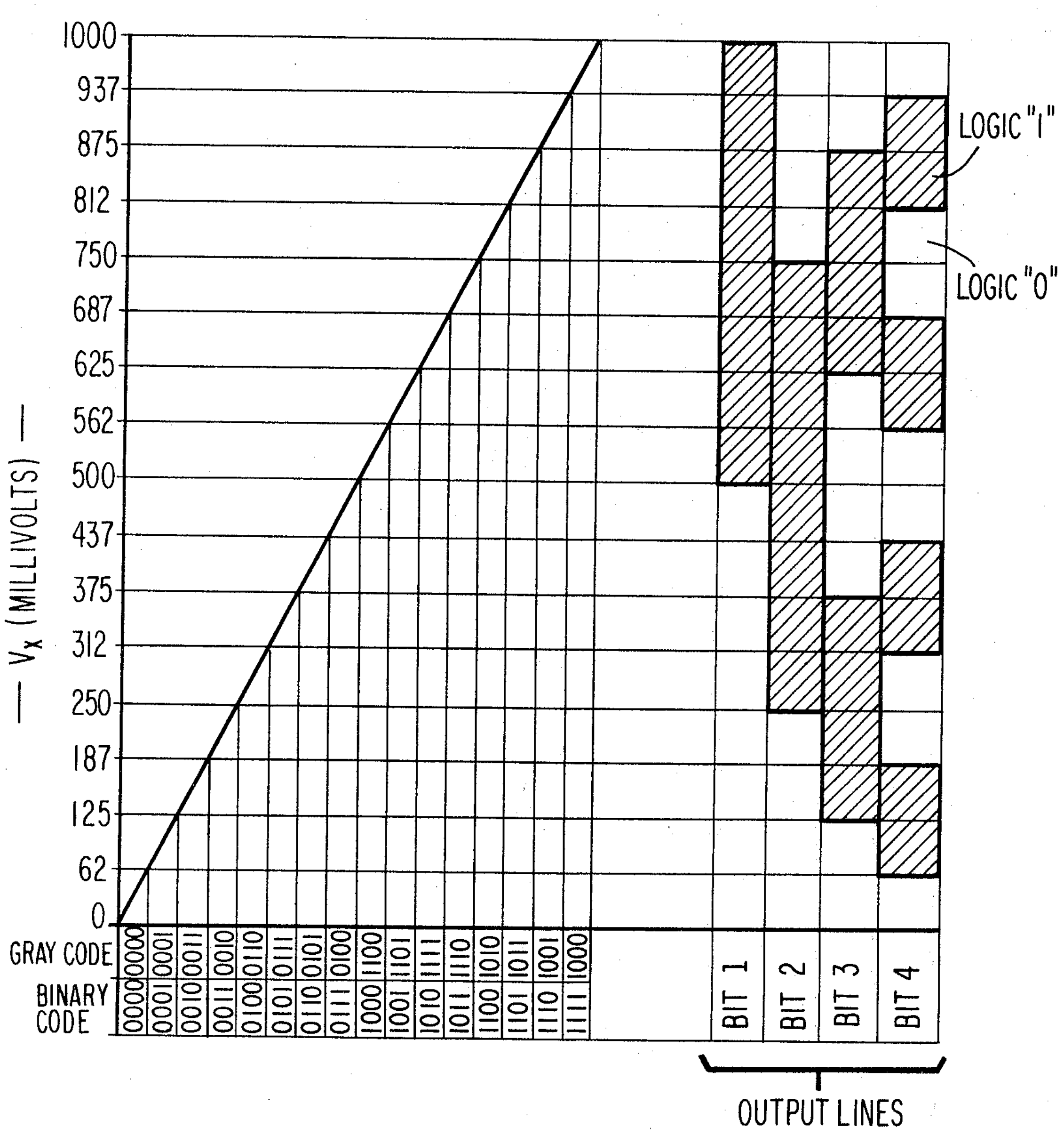
FIG. 2 is a line graph showing the relationship between an analog input voltage and the corresponding digital word of the A/D converter of FIG. 1.

Referring now to the operation of the A/D converter 10 of FIG. 1, the same will be more clearly understood by reference to the line graph of FIG. 2. FIG. 2 is a line graph showing the relationship between the analog input voltage and the corresponding digital word of converter 10 of FIG. 1. The full analog input ($V_x$) voltage range, which has been scaled or normalized to 1 volt, is plotted along the ordinate in millivolts. The 15 voltages, from 62 to 937 millivolts inclusive, correspond to the reference potential inputs at each comparator. The Gray code digital output word corresponding to each quantization level is shown along the abscissa. The equivalent true binary code digital words are shown under the corresponding Gray code words. The logic state, 1 or 0, of each output line corresponding to the full range of $V_x$ is shown opposite and parallel to the $V_x$ ordinate.

Considering first the encoding function of comparator 102 it can be seen that one-half of the full scale voltage (0.500E volts) is applied to the + input of comparator 102. The analog signal $V_x$ to be quantized or converted to a digital word is coupled to the − input of comparator 102. If the magnitude of the 0.500E reference potential is greater than the input signal $V_x$, the output of comparator 102 will be a logic 1. If $V_x$ becomes greater than the 0.500E reference potential, the output of comparator 102 will be a logic 0. Since the output of comparator 102 is coupled to the D input of flip-flop 134, the $\overline{Q}$ output of flip-flop 134 will be the complement of the signal applied to its D input after the application of a clock or Encode Command Pulse to flip-flop 134. Thus, after the clock pulse, the $\overline{Q}$ output flip-flop 134 will be a logic 1 when the analog input signal $V_x$ preceding the clock pulse resides above the reference potential 0.500E. When the input signal, preceding the clock pulse, resides below the reference potential, the $\overline{Q}$ output of flip-flop 134, after the clock pulse, will be a logic 0. Output line 153 therefore provides Bit 1 which represents the most significant bit or half scale output.

Bit 2 is obtained on output line 159 by encoding the outputs of comparators 104 and 106. Comparator 104 is connected in a manner similar to comparator 102 with the exception that the + input of comparator 104 is coupled to a different reference potential (0.250E). The output state of comparator 104 is therefore a logic 0 when $V_x$ is greater than the 0.250E reference potential, and is a logic 1 when $V_x$ is less than the 0.250E reference potential. Comparator 106 is also coupled to a different reference potential (0.750E). Comparator 106, however, has its input connections reversed with respect to comparator 104. In this case, reference potential 0.750E is connected to the − input of comparator 106 and $V_x$ is connected to the + input of comparator 106. The output state of comparator 106 is therefore a logic 0 when $V_x$ is less than the 0.750E reference potential and is a logic 1 when $V_x$ is greater than the 0.750E reference potential. The outputs of comparators 104 and 106 are coupled together so as to provide phantom-OR gate 157. Therefore, a logic 1 output from either comparator 104 or 106 will provide a logic 1 at the output of phantom-OR gate 157. The output of phantom-OR gate 157 will be a logic 0 only when both outputs from comparators 104 and 106 are a logic 0. Since the output of phantom-OR gate 157 is coupled to the D input of flip-flop 136, the $\overline{Q}$ output of flip-flop 136, after each clock pulse, will be a logic 1 only when $V_x$, preceding each clock pulse, resides between 0.250E volts and 0.750E volts. Therefore, the state of the binary digit present on output line 159, which represents Bit 2 of the encoded digital word, will be a logic 1 after each clock pulse only when the analog signal $V_x$, preceding each clock pulse, resides between the reference potentials applied to the respective inputs of comparators 104 and 106.

Bit 3 is provided on output line 163. Bit 3 is obtained in a similar manner to Bit 2 with the exception that there are two sets of comparators, each set being coupled to a respective flip-flop. Comparators 108 and 110 are connected to provide a logic zero at their output whenever $V_x$ resides between 0.125E and 0.375E. The $\overline{Q}$ output of flip-flop 138 is coupled to phantom-OR gate 164 so that the output of gate 164 is a logic 1 whenever a logic 1 appears at the $\overline{Q}$ output of flip-flop 138. Similarly, comparators 112 and 114 are coupled to provide a logic 0 at their respective outputs only when $V_x$ resides between 0.625E and 0.875E. Since the $\overline{Q}$ outputs of flip-flops 138 and 140 are phantom-ORed by gate 164, Bit 3, after each clock pulse, will be a logic 1 whenever $V_x$, preceding each clock pulse, resides between 0.125E and 0.375E, or between 0.625E and 0.875E.

Bit 4 is provided on output line 173 and is obtained in a similar manner with the exception that there are four sets of comparators each set being coupled to a separate flip-flop. The input connections to comparators 116 and 118 are so arranged that the output of phantom-OR gate 172 is a logic 0 only when $V_x$ resides between 0.062E and 0.187E. Accordingly, the $\overline{Q}$ output of flip-flop 142 is a logic 1 only when $V_x$ resides between the two reference potentials coupled to comparators 116 and 118. The three remaining comparator pairs associated with bit 4 on output line 173 are identical in function and structure with the exception of the reference potentials applied to their respective inputs. Accordingly, Bit 4, after each clock pulse, will be a logic 1 only when $V_x$, prior to each clock pulse, resides between the reference voltages coupled to the respective input terminals on any one of the four comparator pairs. The logic state of output Bit 4 is summarized in Table 1 below.

TABLE 1

| | $V_x$ | Output Bit 4 |
|---|---|---|
| | $V_x < 0.062E$ | 0 |
| 0.062E < | $V_x < 0.187E$ | 1 |
| 0.187E < | $V_x < 0.312E$ | 0 |
| 0.312E < | $V_x < 0.437E$ | 1 |
| 0.437E < | $V_x < 0.562E$ | 0 |
| 0.562E < | $V_x < 0.687E$ | 1 |
| 0.687E < | $V_x < 0.812E$ | 0 |
| 0.812E < | $V_x < 0.937E$ | 1 |
| 0.937E < | $V_x$ | 0 |

The logic function performed by the encoding logic of the converter 10 of the present invention, for each output line is depicted in Table 2 below. The logic function is expressed in Boolean algebra. The legends C1 to C15 depict the output states of the comparators.

TABLE 2

$$\text{Bit } 1 = C1$$
$$\text{Bit } 2 = C2 \cdot \overline{C3}$$
$$\text{Bit } 3 = C4 \cdot \overline{C5} + C6 \cdot \overline{C7}$$
$$\text{Bit } 4 = C8 \cdot \overline{C9} + C10 \cdot \overline{C11} + C12 \cdot \overline{C13} + C14 \cdot \overline{C15}$$

It is noted, again, that the logic function which is fully completed immediately after each clock pulse period, is determined by the outputs of the comparators immediately preceding each clock pulse period.

It should now be appreciated that the encoded digital output word which represents the analog input voltage $V_x$, that was present at the output of the comparators immediately preceding each clock pulse period, is available at the output lines immediately after each clock pulse period. Accordingly, the conversion can take place at a sampling rate which is limited only by the clocking rate of the flip-flops. It should be noted that there are no other intervening elements such as logic gates, precision delay lines or sample and hold circuitry as in the prior A/D converters. It should also be appreciated that since the encoded digital output word, of A/D converters in general, is further processed by clocked flip-flop or pipeline circuitry, the logic functions described above are performed with no effective delay. That is, this invention effectively performs the encoding logic function in the otherwise subsequent flip-flop stages and introduces no delay attributable to the logic function itself. It can be seen that the encoding logic of the A/D converter of the present invention senses the simultaneous comparator outputs, stores the comparator outputs over the clocking period and converts the comparator outputs to a Gray code with a conversion speed limited only by the maximum clocking rate of the flip-flop stages.

Figure 3:
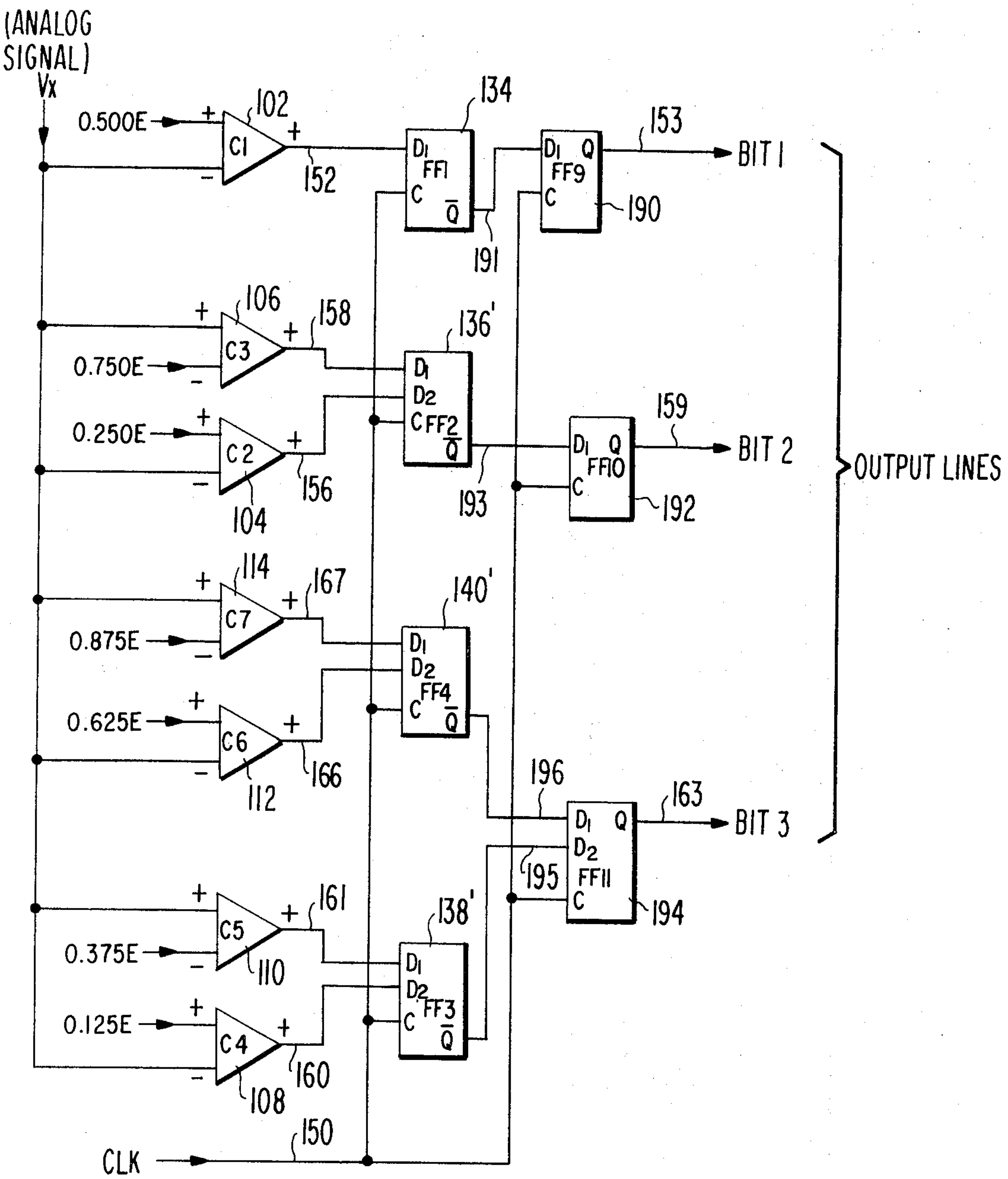
FIG. 3 is a block diagram representing an alternate embodiment of an A/D converter in accordance with the present invention.

Referring now to FIG. 3, there is shown a block diagram representing an alternate embodiment of an A/D converter in accordance with the present invention. For simplicity, the converter of FIG. 3 is shown as a three bit or eight level converter having three output lines. The advantage of the converter of FIG. 3 is that the phantom-OR gate logic function can be realized without conventional wired-OR gates. Accordingly, the converter shown in FIG. 3 can utilize logic element families which are not amenable to the wired-OR version of the phantom-OR gate function. The function of the of the three-line converter of FIG. 3 is similar to the first three output lines of FIG. 1 and accordingly like elements bear like reference numerals. The essential structural difference of the converter of FIG. 3 is that each output line includes an additional flip-flop which are shown with legends FF9, FF10 and FF11. The additional flip-flop FF9 in the first or Bit 1 output line which is designated as flip-flop 190 comprises a D-type flip-flop having a D input coupled to the $\overline{Q}$ output of flip-flop 134 by way of lead 191. The Q output of flip-flop 190 is coupled to output line 153. A clock input C of flip-flop 190 is coupled to clock line 150.

An additional flip-flop 192 is included in the Bit 2 output line 159. Flip-flop 192 is a D-type flip-flop having an input $D_1$ coupled to the $\overline{Q}$ output of flip-flop 136' by way of lead 193. D-type flip-flop 136' is similar to flip-flop 136 of FIG. 1 with the exception that flip-flop 136' includes two D input terminals, designated as $D_1$ and $D_2$ which are electrically isolated from one another. The third bit output line 163 also includes an additional D-type flip-flop 194. Flip-flop 194 includes two electrically isolated D inputs designated as $D_1$ and $D_2$. The $D_1$ input of flip-flop 194 is coupled to the $\overline{Q}$ output of flip-flop 140' by way of lead 196; and the $D_2$ input is coupled to the $\overline{Q}$ output of flip-flop 138' by way of lead 195. Flip-flops 138' and 140' are similar to flip-flops 138 and 140 of FIG. 1 with the exception of the dual electrically isolated D inputs at each flip-flop. Flip-flops 192 and 194 each include a clock input C which is coupled to clock line 150.

The dual inputs of the flip-flops shown in FIG. 3 may take the form, for example, of two input transistors having a common or parallel output circuit point internal to each flip-flop input circuit. The separate transistor input electrodes provide electrically isolated input terminals and the phantom-OR gate function, as described hereinbefore, is nevertheless obtained at the common output circuit point of the two input transistors. It should be noted that the dual input terminals can be readily incorporated into present day high-speed logic families without reducing the basic flip-flop clocking speed.

The embodiment shown in FIG. 3 has the advantage that the circuit can be constructed using logic elements whose outputs cannot be directly coupled together to obtain the phantom-OR gate function. For example, the outputs of CMOS and TTL logic elements are usually not directly coupled together; however, a high-speed logic circuit, in accordance with the principle of the present invention, can be constructed using these logic families in the manner shown in FIG. 3. A further advantage of this embodiment is the reduction of the extra capacitance which may be present in conventional wired-OR configurations.

It is noted that the encoded digital word provided at the output lines of the converter of FIG. 3 is delayed by two clock pulses. However, this presents no disadvantage as the outputs of present day converters are typically processed in a clocked or pipeline logic configuration. The distinguishing advantages of FIG. 3, in accordance with the present invention, is that the encoding logic is not required to absorb any gate delay and that conventional wired-OR connections can be avoided. It should be appreciated that the output of the comparators are available at the $\overline{Q}$ output of flip-flops 134, 136', 140' and 138' immediately after each clock pulse period; and the encoded digital word is available at the converter output lines immediately after the second consecutive clock pulse period. At any stage of the clocked or pipeline output, no differential delays, attributable to the encoding logic, are experienced.

It should be noted that there may be A/D converter applications utilizing the principle of the present invention where sample and hold type operation at the output of the comparators may be desirable. For example, a given logic family flip-flop element may experience different transition times, in response to a clock pulse input, from element to element. During this differential time the analog signal may be changing at a high frequency rate. As a result of the combined effect of the varying signal at the D inputs and the differential transition times, the $\overline{Q}$ outputs at the various flip-flops may exhibit an error which is known, in the art, as "aperture error". This problem may be obviated by incorporating, for example, sample and hold techniques or by strobing the output of the comparators at a rate which is related to the clocking rate of the flip-flops. Again, however, the distinguishing advantage of the present invention is the elimination of the gate delays absorbed in the encoding logic of prior art converters. The advantage of the present invention can be better appreciated by reviewing, for example, the parallel 3-bit A/D converter shown in FIG. 12.27, on page 412 in *Analog-toDigital/Digital-to-Analog Conversion Techniques*, supra.

It should be noted that although the preferred form of the present invention, as illustrated in FIGS. 1 and 3, is arranged to provide a Gray code output, it is also possible to provide a conventional binary code output. This can be accomplished by arranging the various comparators and the respective reference potentials, in accordance with the present invention, so as to generate the required binary code word at each quantization level.

What has been taught, then, is a high-speed analog-to-digital converter which operates with no gate or time delay attributable to its encoding logic. As described above the present invention is particularly suitable for use in parallel or simultaneous A/D converters, thereby permitting the converter to operate at the maximum clocking rate of the flip-flop stages incorporated therein. It will be appreciated that the application of the present invention is not limited to A/D converters having a specific number of output lines. The present invention can be embodied in an A/D converter having any given number of output lines.

What is claimed is:

1. In an analog-to-digital converter having first and second comparator means, each having first and second input terminals and an output terminal, each comparator means providing a binary output signal of a first value when a signal at said first input terminal is greater than a signal at said second input terminal and a binary output signal of the other value when a signal at said first input terminal is less than a signal at said second input terminal;

means for coupling said input terminals of said comparator means to a source of reference potential and to an analog signal input means so that the output signals of said comparator means exhibit like binary values only when the amplitude of said analog signal is between the respective reference potentials applied to said comparator means; and flip-flop means having input means, complementary output means and a clock input means for receiving a clock signal, for providing a binary output signal value complementary to the binary input value at said complementary output means in response to a clock signal being applied to said clock input means;

the improvement comprising:

means for coupling the output signals of said first and second comparator means to said input means of said flip-flop means to provide a phantom logic gate, whereby the logical sum of the output signals of said first and second comparator means provides a binary input signal at said input means of said flip-flop, said binary input signal being a signal of one binary value when the amplitude of said analog signal is between the reference potentials applied to said first and second comparator means, and a signal of the opposite binary value when the amplitude of said analog signal is not between the reference potentials applied to said first and second comparator means, and the complement of said binary input signal is provided at said complementary output means of said flip-flop means in response to said clock signal without adding a gate delay.

* * * * *